United States Patent
van Adrichem

(10) Patent No.: US 7,695,871 B2
(45) Date of Patent: Apr. 13, 2010

(54) NOTCHED TRIM MASK FOR PHASE SHIFTING MASK

(75) Inventor: Paulus J. M. van Adrichem, Cupertino, CA (US)

(73) Assignee: Synopsys, Inc., Mountain View, CA (US)

( * ) Notice: Subject to any disclaimer, the term of this patent is extended or adjusted under 35 U.S.C. 154(b) by 726 days.

(21) Appl. No.: 11/245,549

(22) Filed: Oct. 6, 2005

(65) Prior Publication Data

US 2007/0082276 A1    Apr. 12, 2007

(51) Int. Cl.
    *G03F 1/00*    (2006.01)
(52) U.S. Cl. .................. 430/5; 716/19; 716/21
(58) Field of Classification Search ........... 430/5; 716/19, 21
    See application file for complete search history.

(56) References Cited

U.S. PATENT DOCUMENTS

2002/0127479 A1 * 9/2002 Pierrat ............... 430/5
2004/0043305 A1 * 3/2004 Park et al. .......... 430/5
2004/0219436 A1 * 11/2004 Zhang ............... 430/5

* cited by examiner

Primary Examiner—Mark F Huff
Assistant Examiner—Stewart A Fraser
(74) Attorney, Agent, or Firm—Bever, Hoffman & Harms, LLP; Jeanette S. Harms

(57) ABSTRACT

A phase shifting mask (PSM) and a trim mask can be used in a dual exposure to form circuits on an integrated circuit. The trim mask can include first structures that define non-critical features of a design (e.g. line ends), second structures that protect areas exposed by phase shifters, wherein such areas including critical features (e.g. transistor gates) of the design, and transitional areas located between the first and second structures. Notably, these transitional areas can include notches. This notched trim mask can advantageously minimize line end widening, thereby improving feature definition and device performance on the resulting integrated circuit. The notched trim mask can also advantageously simplify the optical proximity correction of its associated PSM, thereby minimizing fabrication costs.

3 Claims, 10 Drawing Sheets

NOTCHED TRIM MASK FOR PHASE SHIFTING MASK

BACKGROUND OF THE INVENTION

1. Field of the Invention

The present invention relates to a trim mask for use with a phase shifting mask (PSM) and in particular to a notched trim mask that can improve feature definition and device performance on the integrated circuit as well as simplify the optical proximity correction on the associated PSM layer.

2. Description of the Related Art

FIG. 1 illustrates a simplified representation of an exemplary digital integrated circuit design flow 100. At a high level, the process starts with the product idea in step 101. In designing an integrated circuit (IC), engineers typically rely upon computer-implemented tools to help create a circuit schematic design consisting of individual devices coupled together to perform a certain function. In one embodiment, these computer-implemented tools include EDA software 102, which can translate the circuit into a physical representation, i.e. a layout. When the layout is finalized, it can be used during tape-out 103. After tape out, fabrication 104 as well as packaging and assembly 105 can proceed to produce the IC 106, also called a chip.

Note that EDA software 102 can perform a plurality of steps 110-119, which are shown in linear fashion for simplicity in FIG. 1. In an actual IC design process, various steps may be repeated until certain tests are passed. Moreover, these steps may occur in different orders and combinations. Therefore, these steps are described below for context and general explanation rather than as a specific, or recommended, design flow for a particular IC.

In step 110, engineers can describe the functionality that they want to implement in a system design, perform what-if planning to refine that functionality, and check the costs associated with the system design. Hardware-software architecture partitioning can occur in this step. Exemplary EDA software products from Synopsys, Inc. that can be used at this step include Model Architect, Saber, System Studio, and DesignWare® products.

In step 111, the VHDL or Verilog code for modules in the system design, i.e. the logic design, can be written and then verified for functional accuracy (e.g. checked to ensure that the logic design produces the correct outputs). Exemplary EDA software products from Synopsys, Inc. that can be used in step 111 include VCS, VERA, DesignWare®, Magellan, Formality, ESP and LEDA products.

In synthesis and design for test step 112, the VHDL/Verilog code can be translated to a netlist. This netlist can then be optimized for the target technology. Additionally, tests for checking the finished IC can be designed and implemented. Exemplary EDA software products from Synopsys, Inc. that can be used at this step include Design Compiler®, Physical Compiler, Test Compiler, Power Compiler, FPGA Compiler, Tetramax, and DesignWare® products.

In netlist verification step 113, the netlist can be checked for compliance with timing constraints and for correspondence with the VHDL/Verilog code. Exemplary EDA software products from Synopsys, Inc. that can be used at this step include Formality, PrimeTime, and VCS products.

In design planning step 114, an overall floorplan for the chip is constructed and analyzed for timing and top-level routing. Exemplary EDA software products from Synopsys, Inc. that can be used at this step include Astro and IC Compiler products.

In physical implementation step 115, the circuit elements of the logic design can be positioned and connected (generally called "place and route"). Exemplary EDA software products from Synopsys, Inc. that can be used in step 115 include the Astro and IC Compiler products.

In analysis and extraction step 116, the circuit function can be verified at a transistor level, thereby permitting what-if refinement. Exemplary EDA software products from Synopsys, Inc. that can be used in step 116 include AstroRail, PrimeRail, Primetime, and Star RC/XT products.

In physical verification step 117, various checking functions can be performed to ensure correctness for manufacturing, electrical issues, lithographic issues, and circuitry. Exemplary EDA software products from Synopsys, Inc. that can be used in step 117 include the Hercules product.

In resolution enhancement step 118, the layout can be manipulated to improve manufacturability of the design. Exemplary EDA software products from Synopsys, Inc. that can be used in step 118 include Proteus, ProteusAF, and PSMGen products.

In mask data preparation step 119, the "tape-out" data for production of masks for lithographic use can be generated. Exemplary EDA software products from Synopsys, Inc. that can be used in step 119 include the CATS(R) family of products.

Due to the ever-increasing reduction in feature sizes on ICs, improvements to resolution enhancement are constantly being sought. Unfortunately, providing these improvements in a commercially viable manner is highly challenging. Such improvements in the context of a phase shift mask are now discussed.

SUMMARY OF THE INVENTION

An advanced technique in lithography called phase shifting can advantageously generate features on a wafer that are smaller than the wavelength of the light source of the exposure tool used to image these patterns. In this technique, a phase shifting mask (PSM) and a trim mask are used in a dual exposure. Line end widening is a common problem when using a standard PSM and trim mask.

A trim mask solving the line end widening problem can include a first structure for defining a non-critical feature of a layout (e.g. a line end), a second structure for protecting an area exposed by the PSM and defining a critical feature (e.g. a gate of a transistor), and a transitional area located between the first and second structures, wherein the transitional area includes a notch. This notched trim mask can advantageously minimize line end widening, thereby improving feature definition and device performance on the resulting integrated circuit. The notched trim mask can also advantageously simplify the optical proximity correction of its associated PSM, thereby minimizing fabrication costs.

A mask set used for fabricating an integrated circuit can include the above-described trim mask and an associated PSM for defining critical features of a layout for the IC. With this trim mask, the PSM can advantageously include minimal optical proximity correction (OPC) without violating mask manufacturing rules. The OPC following the PSM shifter and trim placement can further smooth the line end. In one embodiment, the OPC is provided at least to an edge defining the gate of the transistor. In one embodiment, the line end as defined on the trim mask can also include OPC, e.g. a hammerhead, to extend the printed line end.

A layout for a trim mask is also described. This layout includes also a first structure for defining a non-critical feature of a design, a second structure for protecting an area to be exposed by a phase shifting mask (PSM) and defining a critical feature of the design, and a transitional area located between the first and second structures, wherein the transitional area includes a notch. A trim mask can be fabricated by accessing this trim mask layout and then using it to make the trim mask.

Electronic design automation (EDA) software for designing an integrated circuit is also described. The EDA software can include code for providing resolution enhancement of a trim mask layout. The code can include instructions for providing the first and second structures as well as the notched transitional area located between the first and second structures.

DETAILED DESCRIPTION OF THE FIGURES

In accordance with one aspect of the invention, a trim mask with notched transition areas near a line end can significantly improve feature definition and device performance on the resulting integrated circuit. This notched trim mask can also advantageously simplify an associated phase shift mask (PSM), thereby reducing fabrication costs. A mask overview is now provided to better understand and appreciate the advantages of this notched trim mask.

Mask Overview

Figure 1:
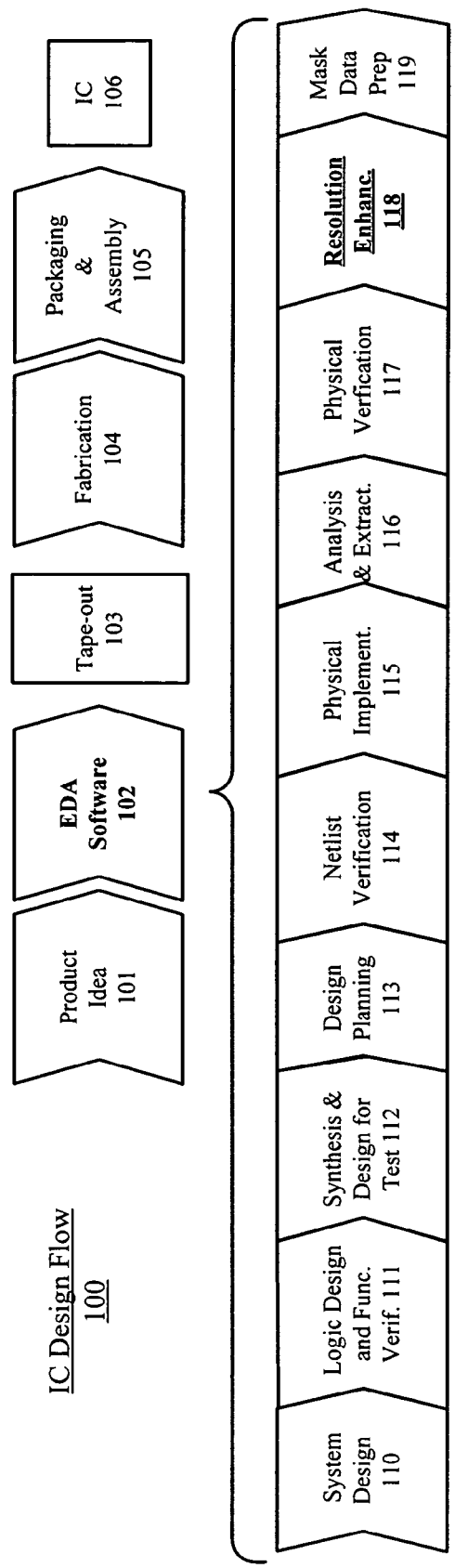
FIG. 1 illustrates a simplified integrated circuit design flow and, in particular, exemplary steps that can be performed by EDA software in such a design flow.

Generally, a mask (usually a quartz plate coated with chrome) is created for each layer of the integrated circuit (IC) design. In less complicated and dense ICs, each mask comprises the features that represent the desired circuit pattern for its corresponding layer. In more complicated and dense ICs in which the size of the features approach the optical limits of the lithography process, the masks may also comprise sub-wavelength, optical proximity correction (OPC) structures, such as serifs, hammerheads, bias and assist bars, which are generated in resolution enhancement step 118 (FIG. 1) to compensate for proximity effects.

These masks are then used during fabrication 104 to project their patterns onto the wafer coated with photoresist material. For each layer of the design, a light (visible/non-visible radiation) is shone on the mask corresponding to that layer. This light passes through the clear regions of the mask, whose image exposes the underlying photoresist layer, and is blocked by the opaque regions of the mask, thereby leaving that underlying portion of the photoresist layer unexposed. The exposed photoresist layer is then developed, typically through chemical removal of the exposed/non-exposed regions of the photoresist layer. The result is a wafer coated with a photoresist layer exhibiting the desired pattern, which defines the features of that layer. This lithographic process is then repeated for each layer of the design.

One advance in lithography called phase shifting is able to generate features on the wafer that are smaller than the corresponding wavelength of the light. These ultra-small features are generated by the destructive interference of light in adjacent, complementary pairs of phase shifters having opposite phase, e.g. 0 and 180 degrees. In one embodiment, the phase shifters can be formed on a phase shifting mask (PSM), which is used in conjunction with a trim (i.e. binary) mask including the above-described features of the layout. In the PSM, complementary phase shifters (hereinafter referred to as shifters) are configured such that the exposure radiation transmitted by one shifter is 180 degrees out of phase with the exposure radiation transmitted by the other shifter. Therefore, rather than constructively interfering and merging into a single image, the projected images destructively interfere where their edges overlap, thereby creating a clear and very small image between the phase shifters.

Figure 2A:
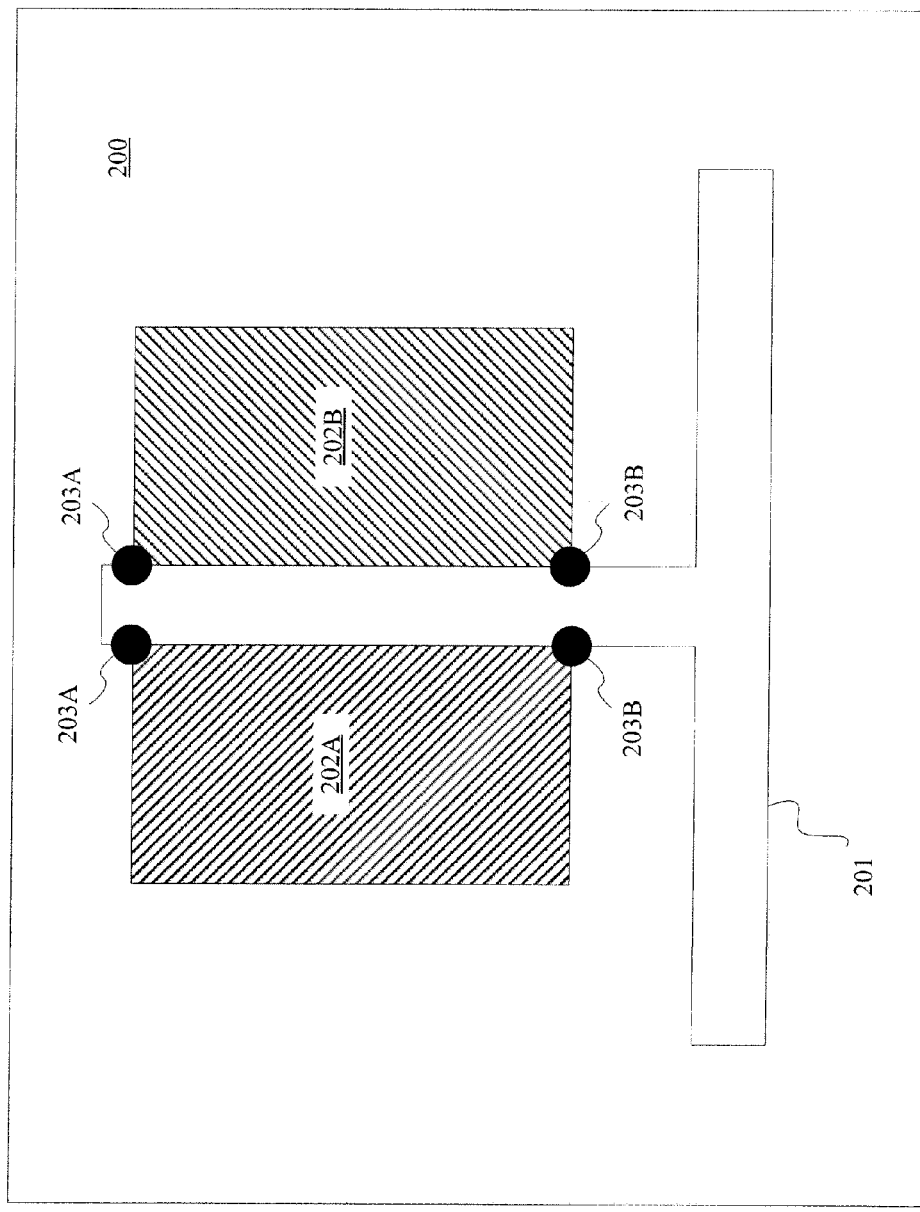
FIG. 2A illustrates a portion of a phase shifting mask (PSM) superimposed on a corresponding portion of a layout.

FIG. 2A illustrates a portion of a phase shifting mask (PSM) 200 superimposed on a corresponding portion of a layout (shown as a dotted line). The layout includes a feature 201 that could implement a gate of a transistor. Shifters 202A and 202B are associated with feature 201. Note that shifters 202A and 202B can be light transmissive areas on an otherwise opaque PSM mask (feature 201 is shown in FIG. 2 for context only).

Without shifters 202A and 202B, the projection of feature 201 onto a wafer would be limited by the resolution of the optical process. However, if the light of a single wavelength passing through one of the shifters, e.g. shifter 202A, is out of phase (by 180 degrees or Π radians) with the light of the same wavelength passing through the other shifter, e.g. shifter 202B, then an interference pattern is set up on the wafer. (For ease of reference, shifters of a different phase are indicated with a different fill pattern.) This interference generates a printed feature having a width that is less than the width that could be achieved using only feature 201 on a binary mask.

Figure 2B:
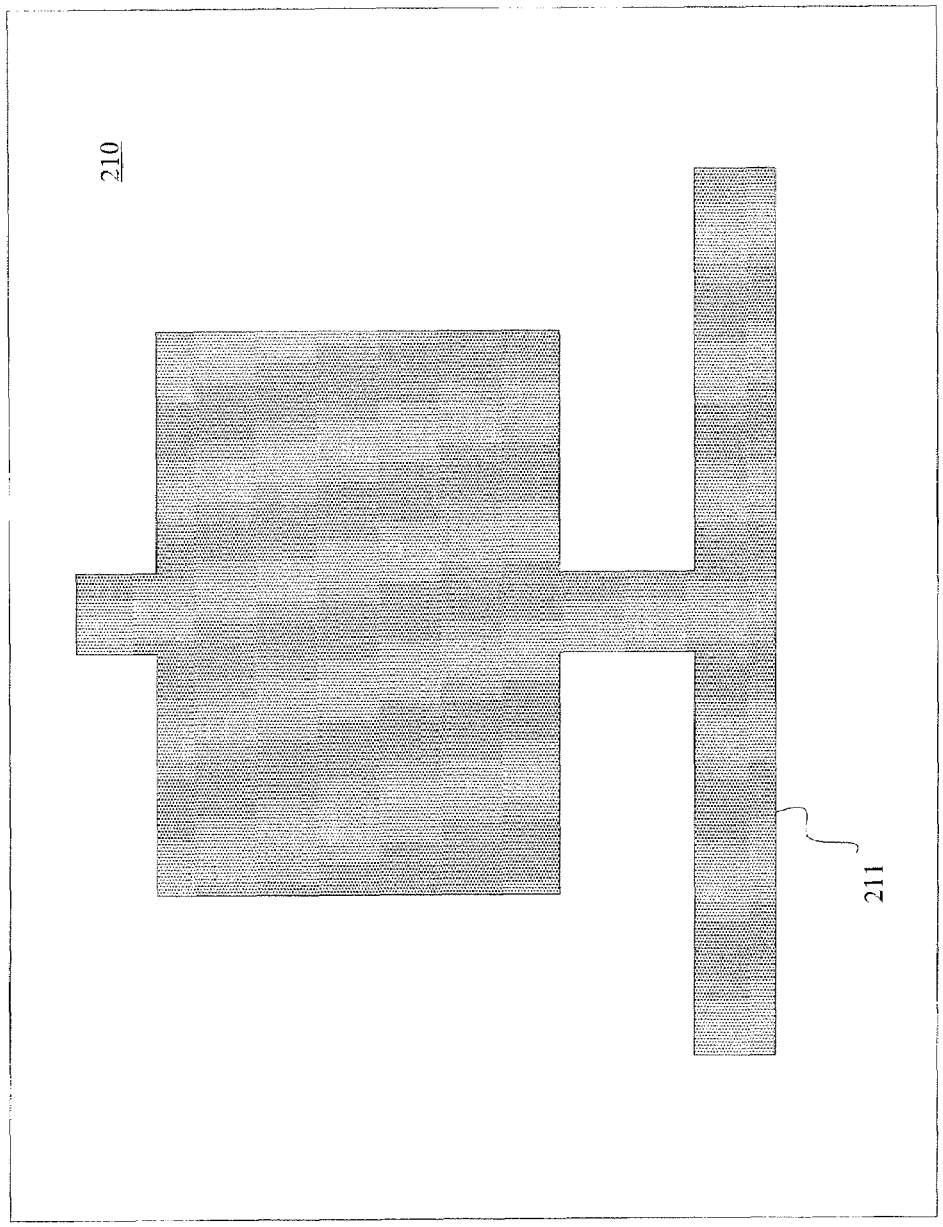
FIG. 2B illustrates a light field trim mask that can be used in conjunction with the PSM of FIG. 2A.

FIG. 2B illustrates a light field trim mask 210 that can be used in conjunction with PSM 200 (FIG. 2A). Specifically, shifters 202A and 202B of PSM 200 can be used to define certain critical edges of a feature, i.e. the gate of a transistor, whereas an opaque structure 211 of trim mask 210 can be used to define the other edges of the feature (i.e. non-gate edges including line ends) as well as protect the areas exposed by shifters 202A and 202B. Thus, trim mask 210 can be characterized as including first structures for defining non-critical features of the layout and second structures for protecting areas exposed by PSM 200 that define critical features of the layout. Notably, referring back to FIG. 2A, transition areas 203A and 203B can be characterized as areas defined by both PSM 200 as well as trim mask 210 (FIG. 2B).

Figure 2C:
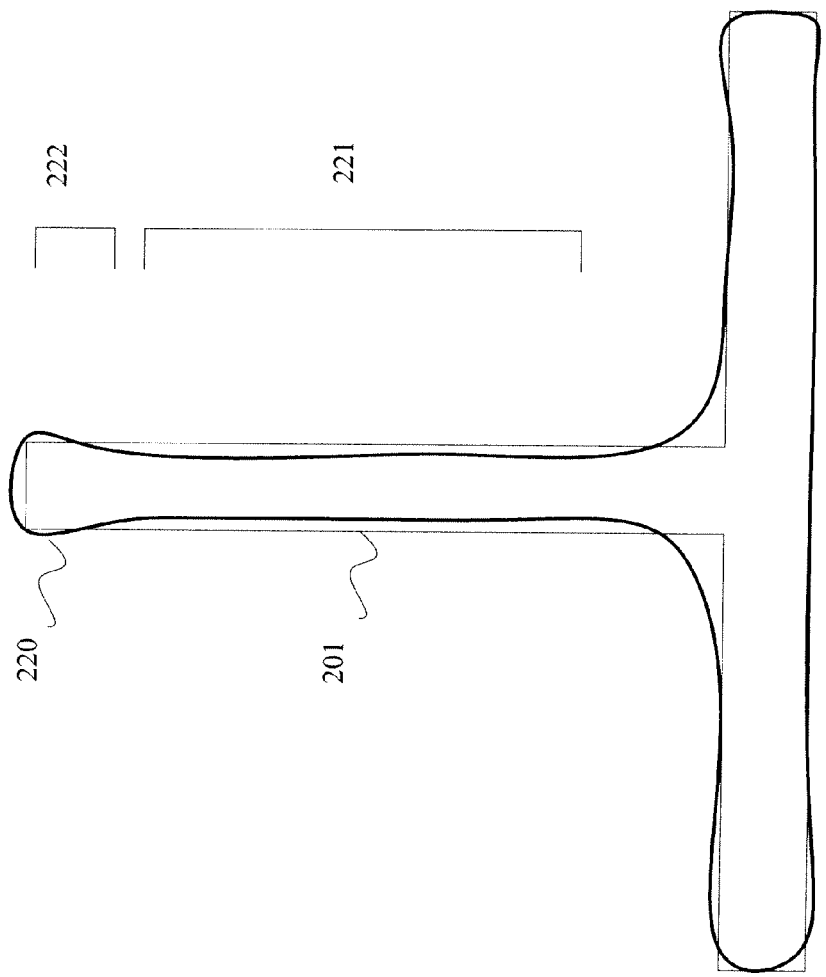
FIG. 2C illustrates an aerial image feature assuming a double exposure using the PSM of FIG. 2A and the trim mask of FIG. 2B.

FIG. 2C illustrates an aerial image feature 220 (determined by simulation) assuming a double exposure using PSM 200 (FIG. 2A) and trim mask 210 (FIG. 2B). Note that when compared to layout feature 201 (shown for context), gate area 221 shows a desirable, i.e. thinner, width. Unfortunately, a line end area 222 exhibits an undesirable widening. This widening coincides with transition areas 203A (FIG. 2A). This widening could cause undesirable current characteristics in the resulting transistor.

Line End Widening Solutions

In one technique to compensate for this line end widening, the negative trim overlap can be increased. That is, the opaque area associated with protecting the phase shifted exposure is typically slightly smaller, e.g. on the order of 35-50 nm, than the phase shifters (referring to edges that are not directly adjacent the layout feature). Unfortunately, increasing this negative trim overlap can undesirably impact the process window. Specifically, the contrast at transition areas 203A and 203B is being reduced. This reduction in contrast can result in edge irregularities at transition areas 203A and 203B, thereby decreasing performance of the resulting transistor.

Figure 2D:
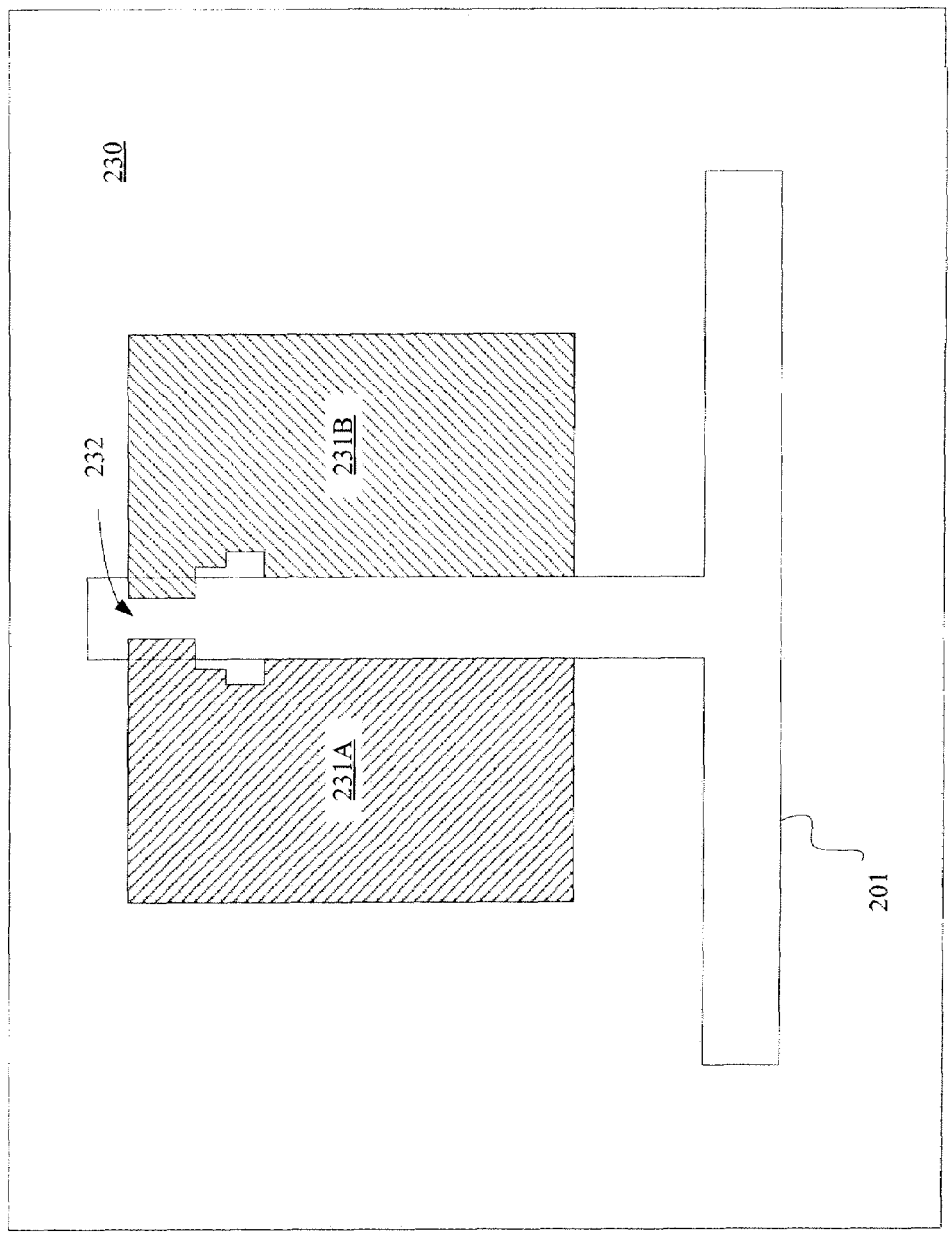
FIG. 2D illustrates a portion of a PSM including OPC-corrected shifters that can compensate for the line end widening described in reference to FIG. 2C.

In another technique to compensate for line end widening, optical proximity correction (OPC) can be performed on the shifters. (Note that model-based OPC using simulation of line edge segments and/or rule-based OPC using a rule table can be performed.) FIG. 2D illustrates a portion of a PSM 230 including OPC-corrected shifters 231A and 231B that can compensate for the line end widening described in reference to FIG. 2C. Once again, layout feature 201 is shown for context.

Unfortunately, OPC-corrected shifters 231A and 231B now exhibit a separation 232 that often violates mask manufacturing rules. A violation of mask manufacturing rules means that PSM 230 cannot be fabricated. Therefore, using only OPC-corrected shifters cannot eliminate line end widening.

Figure 3A:
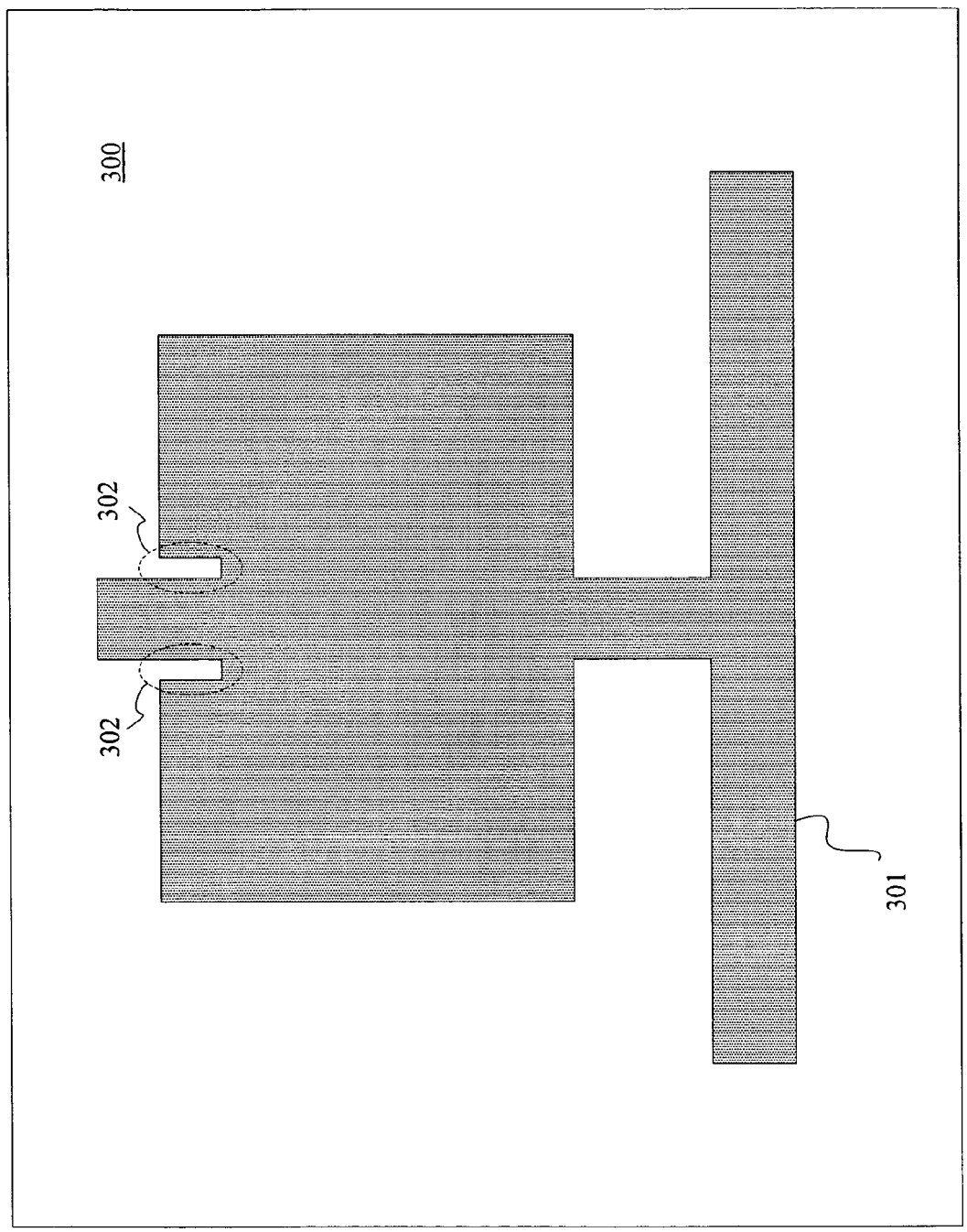
FIG. 3A illustrates an exemplary trim mask including notches in the transition areas, i.e. at the areas definable by both the trim mask and an associated PSM.

In accordance with one aspect of the invention, notches can be made on the trim mask at the transition areas associated with a line end before OPC is performed. For example, FIG. 3A illustrates an exemplary trim mask 300 including notches 302 in an opaque structure 301. Notably, notches 302 are formed at the transition areas, i.e. at the areas definable by both trim mask 300 and an associated PSM, associated with the line end. As shown in FIG. 3A, two narrow notches 302 extend below an outer edge of a first structure for protecting an area exposed by the associated PSM, and are aligned with a second structure for defining a non-critical feature of the layout, wherein the first and second structures share a common centerline. Notches 302 can substantially eliminate line end widening while maintaining the process window, i.e. the contrast, at the gate.

Figure 3B:
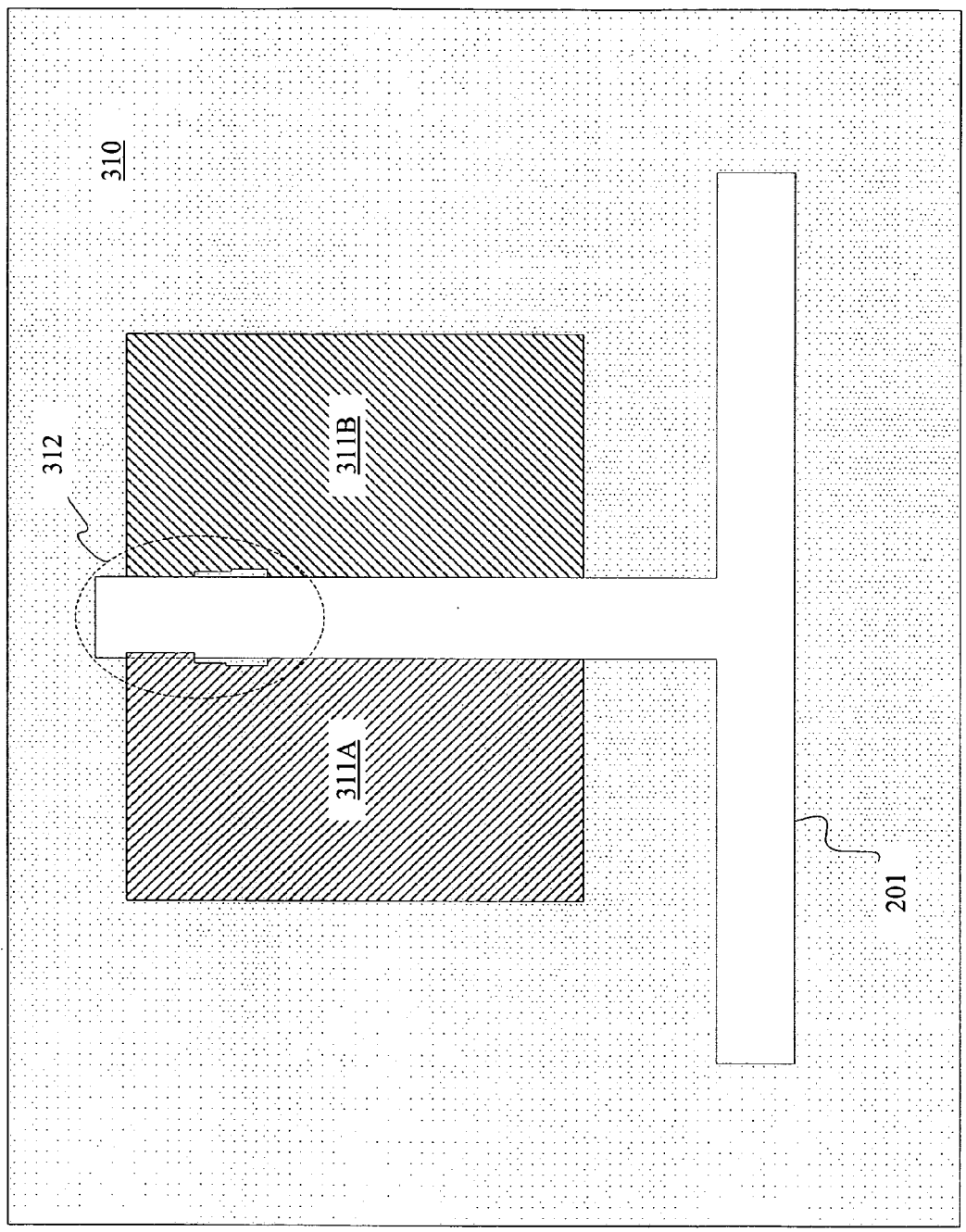
FIG. 3B illustrates an exemplary PSM including OPC-corrected shifters that can be used in conjunction with the trim mask of FIG. 3A.

Moreover, notches 302 can advantageously minimize the OPC provided on the associated PSM, thereby eliminating the possibility of a mask manufacturing rule violation. For example, FIG. 3B illustrates an exemplary associated PSM 310 including OPC-corrected shifters 311A and 311B. Layout feature 201 is shown for context. Because notches 302 (FIG. 3A) provide the principal correction for line end widening, OPC-corrected shifters 311A and 311B need only provide for minimal correction. Thus, compared to PSM 230 (FIG. 2D), PSM 310 has relatively minor OPC corrections in area 312. Notably, the PSM is typically more difficult to make than the trim mask. Therefore, simplification of the PSM can advantageously reduce total IC fabrication.

Figure 3C:
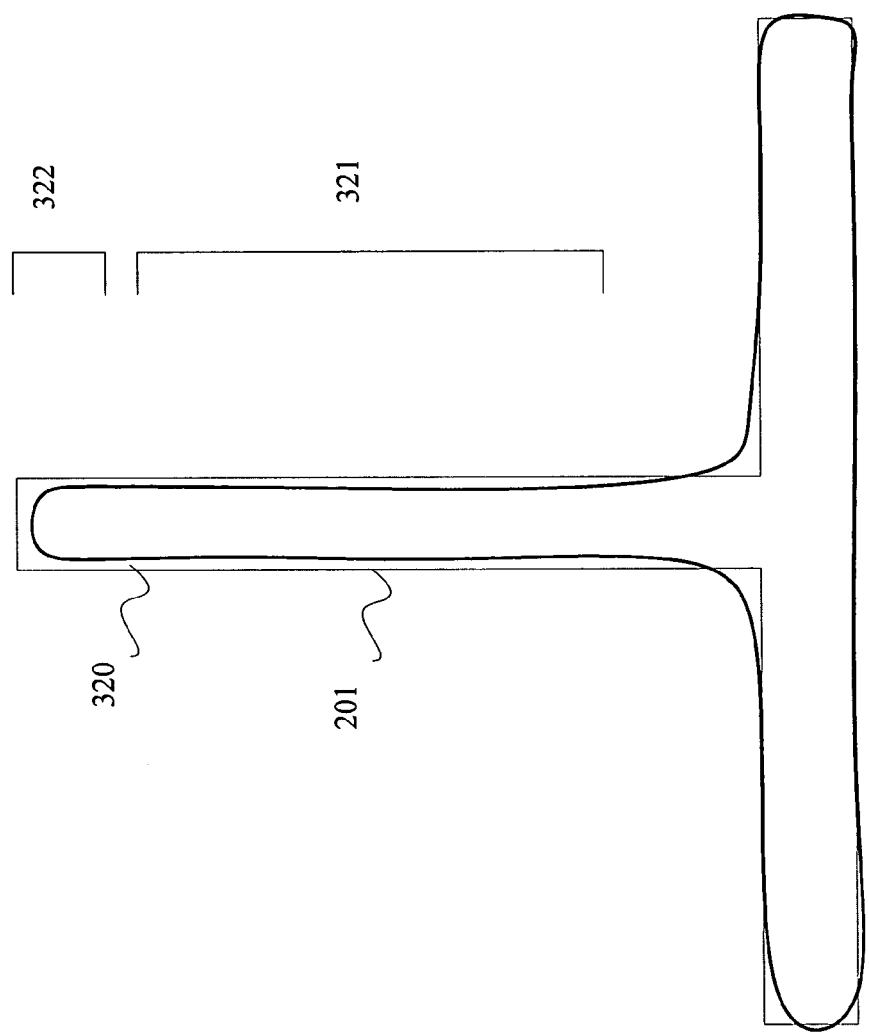
FIG. 3C illustrates an aerial image feature assuming a double exposure using the PSM of FIG. 3B and the trim mask of FIG. 3A.

FIG. 3C illustrates an aerial image feature 320 (determined by simulation) assuming a double exposure using PSM 310 (FIG. 3B) and trim mask 300 (FIG. 3A). Note that when compared to layout feature 201 (shown for context), gate area 321 continues to show a desirable, i.e. more constant, width along line end area 322. Moreover, a line end area 322 now falls within the line edges defining feature 201 without line end widening.

Figure 3D:
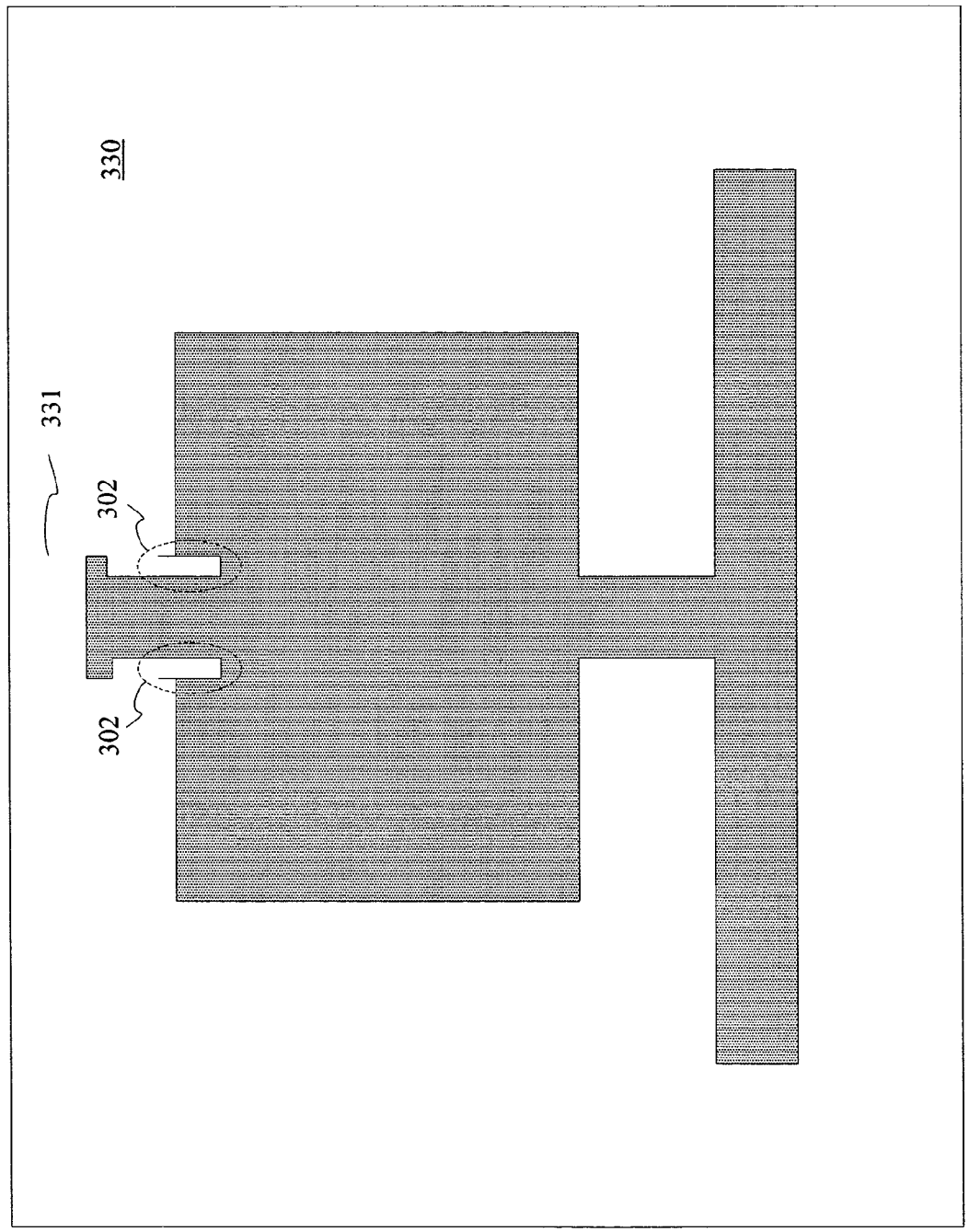
FIG. 3D illustrates an improved trim mask including both notches to smooth the line end as well as some OPC to fine tune the length of the line end.

At this point, standard OPC can be used to fine tune line end area 322. For example, FIG. 3D illustrates an exemplary trim mask 330 including notches 302 as well as a tuning OPC 331. In one embodiment, tuning OPC 331 includes a hammerhead.

Figure 3E:
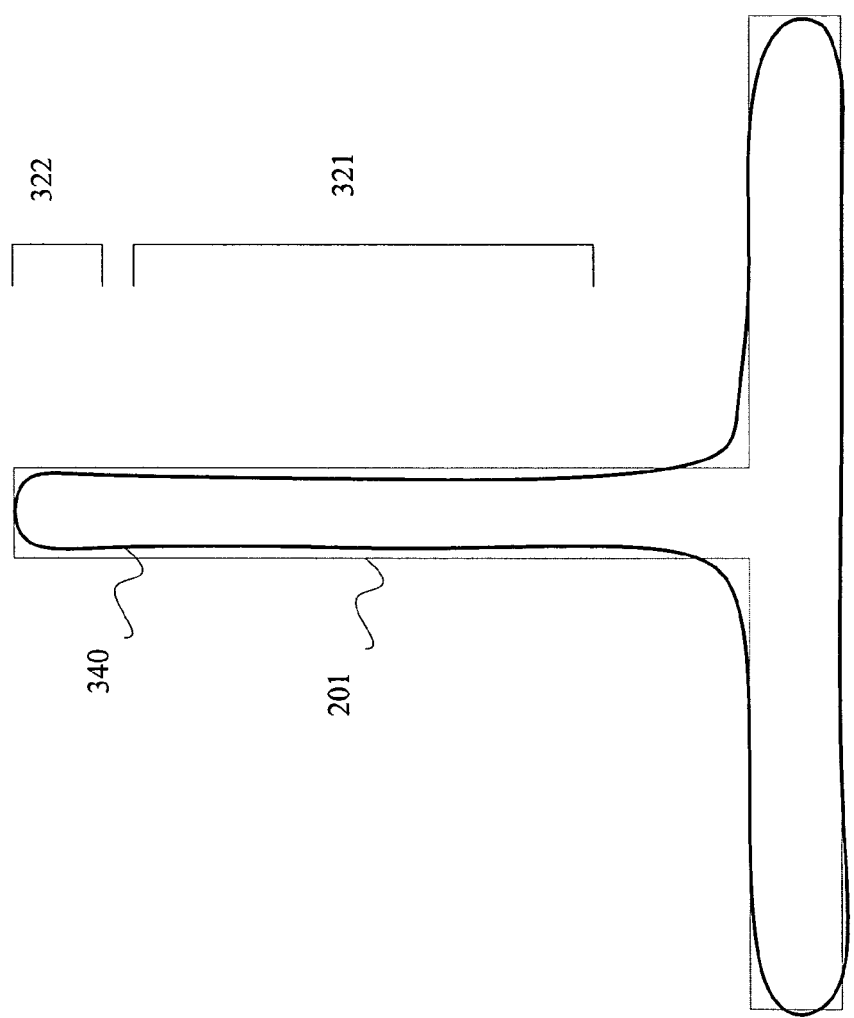
FIG. 3E illustrates an aerial image feature assuming a double exposure using the PSM of FIG. 3B and the trim mask of FIG. 3D.

FIG. 3E illustrates an aerial image feature 340 (determined by simulation) assuming a double exposure using PSM 310 (FIG. 3B) and trim mask 340 (FIG. 3D). Note that when compared to layout feature 201 (shown for context), line end area 322 of aerial image feature 340 now closely matches the desired line end of layout feature 201.

In one embodiment, the notched trim layer can be selectively used based on whether the feature is in a less densely spaced portion or a densely spaced portion of the layout. Specifically, the notched trim layer may be particularly effective in less densely spaced portions of the layout. Therefore, for example, EDA software 102 (FIG. 1) can include spacing detection logic to assist in resolution enhancement 118, wherein the spacing detection logic can notch the trim layer in less densely spaced portions of the layout.

Note that a trim mask layout as well as the resulting trim mask made using that layout will both exhibit the above-described notching. In one embodiment, electronic design automation (EDA) software for designing an integrated circuit can include the code for providing resolution enhancement of a trim mask layout. This code can include a first set of instructions for providing a first structure that defines a non-critical feature of a design. A second set of instructions can provide a second structure that protects an area defined by an associated phase shifting mask (PSM) layout, wherein the area is associated with a critical feature of the design. A third set of instructions can provide a transitional area located between the first and second structures, wherein the transitional area includes a notch.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, in FIG. 3B, only the edges of shifters 311A and 311B directly in interaction with the intended line edges are modified with OPC. In other embodiments, other edges of shifters 311A and 311B may be modified (e.g. to compensate for the inherent transmission loss of the 180° shifter).

Note that the double exposure including the PSM and trim masks can be performed in any order. That is, in one embodiment, the PSM can be exposed first and the trim mask can be exposed second. In another embodiment, the trim mask can be exposed first and the PSM can be exposed second. Thus, as used herein, any reference to protecting areas "exposed" by the PSM (or phase shifters) also includes areas that will be exposed by the PSM (or phase shifters).

Note that although the notches described above can be placed near a line end, notches can also be applied at any trim to shifter transition area. Accordingly, it is intended that the scope of the invention be defined by the following claims and their equivalents.

The invention claimed is:

1. A method of fabricating a trim mask, the method comprising:

accessing a layout for a pre-OPC trim mask, the layout including:

a first structure for defining a non-critical feature of a design, the first structure forming a line end;

a second structure for protecting an area exposed by phase shifters, the area defining a critical feature of the design; and transitional areas located between the first and second structures, wherein the transitional areas include notches that extend below an outer edge of the second structure and are aligned with sides of the first structure, the notches for minimizing line end widening;

performing OPC on the layout to generate an OPC-corrected layout; and fabricating the trim mask using the OPC-corrected layout.

2. A method of designing a pre-OPC trim mask for use with an associated phase shifting mask (PSM), the method comprising:

providing a first structure for defining a non-critical feature of a design;

providing a second structure for protecting an area exposed by the associated PSM, the area defining a critical feature of the design; and providing a transitional area located between the first and second structures, wherein the transitional area includes a notch; and outputting a design for the pre-OPC trim mask.

3. A method of fabricating a trim mask, the method comprising:

accessing a layout for a pre-OPC trim mask, the layout including:

a first structure for defining a non-critical feature of a design, the first structure forming a line end;

a second structure for protecting an area exposed by phase shifters, the area defining a critical feature of the design; and a transitional area located between the first and second structures, wherein the transitional area includes a notch, and wherein the first and second structures share a common centerline;

performing OPC on the layout to generate an OPC-corrected layout; and fabricating the trim mask using the OPC-corrected layout.

* * * * *